(12) United States Patent
Chiu et al.

(10) Patent No.: US 10,734,299 B2
(45) Date of Patent: Aug. 4, 2020

(54) PACKAGE WITH TILTED INTERFACE BETWEEN DEVICE DIE AND ENCAPSULATING MATERIAL

(71) Applicant: Taiwan Semiconductor Manufacturing Company, Ltd., Hsinchu (TW)

(72) Inventors: Ming-Yen Chiu, Zhubei (TW); Hsin-Chieh Huang, Hsinchu (TW); Ching Fu Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/223,783

(22) Filed: Dec. 18, 2018

(65) Prior Publication Data

US 2019/0122948 A1 Apr. 25, 2019

Related U.S. Application Data

(60) Continuation of application No. 15/924,916, filed on Mar. 19, 2018, now Pat. No. 10,163,745, which is a
(Continued)

(51) Int. Cl.
*H01L 21/46* (2006.01)
*H01L 23/31* (2006.01)
(Continued)

(52) U.S. Cl.
CPC .... *H01L 23/3107* (2013.01); *H01L 21/31053* (2013.01); *H01L 21/31058* (2013.01);
(Continued)

(58) Field of Classification Search
CPC ......... H01L 21/31053; H01L 21/31058; H01L 21/561; H01L 21/568; H01L 21/76895;
(Continued)

(56) References Cited

U.S. PATENT DOCUMENTS 7,625,779 B2   12/2009   Takahashi
7,955,955 B2    6/2011   Lane et al.
(Continued)

FOREIGN PATENT DOCUMENTS

CN   101789392 A   7/2010
CN   102856279 A   1/2013
(Continued)

OTHER PUBLICATIONS

"Embedded Wafer Level Ball Grid Array", downloaded from Wikipedia on Sep. 1, 2016, https://en.wikipedia.org/wiki/Embedded_Wafer_Level_Ball_Grid_Array#Process_Steps, 2 pages.

*Primary Examiner* — Luan C Thai
(74) *Attorney, Agent, or Firm* — Slater Matsil, LLP

(57) ABSTRACT

A method includes forming a polymer layer covering a metal via in a wafer, grooving the wafer to form a trench, wherein the trench extends from a top surface of the polymer layer into the wafer, and performing a die-saw on the wafer to separate the wafer into a plurality of device dies. A kerf passes through the trench. One of the device dies is placed over a carrier. An encapsulating material is dispensed over and around the device die. The method further includes pressing and curing the encapsulating material. After the encapsulating material is cured, a sidewall of the polymer layer is tilted. A planarization is performed on the encapsulating material until the polymer layer and the metal via are exposed. A redistribution line is formed over and electrically coupled to the metal via.

20 Claims, 20 Drawing Sheets

Related U.S. Application Data division of application No. 15/254,472, filed on Sep. 1, 2016, now Pat. No. 9,922,895.

(60) Provisional application No. 62/332,252, filed on May 5, 2016.

(51) Int. Cl.

| | | |
|---|---|---|
| *H01L 21/78* | (2006.01) | |
| *H01L 23/48* | (2006.01) | |
| *H01L 21/56* | (2006.01) | |
| *H01L 21/3105* | (2006.01) | |
| *H01L 21/768* | (2006.01) | |
| *H01L 23/00* | (2006.01) | |
| *H01L 25/10* | (2006.01) | |

(52) U.S. Cl.
CPC .......... *H01L 21/561* (2013.01); *H01L 21/568* (2013.01); *H01L 21/76895* (2013.01); *H01L 21/78* (2013.01); *H01L 23/3128* (2013.01); *H01L 23/3135* (2013.01); *H01L 23/481* (2013.01); *H01L 24/05* (2013.01); *H01L 24/19* (2013.01); *H01L 24/97* (2013.01); *H01L 25/105* (2013.01); *H01L 2224/04105* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/12105* (2013.01); *H01L 2224/16227* (2013.01); *H01L 2224/16235* (2013.01); *H01L 2224/32225* (2013.01); *H01L 2224/73204* (2013.01); *H01L 2224/73267* (2013.01); *H01L 2224/92125* (2013.01); *H01L 2224/94* (2013.01); *H01L 2225/1035* (2013.01); *H01L 2225/1058* (2013.01); *H01L 2924/1032* (2013.01); *H01L 2924/10253* (2013.01); *H01L 2924/10271* (2013.01); *H01L 2924/10272* (2013.01); *H01L 2924/14* (2013.01); *H01L 2924/1431* (2013.01); *H01L 2924/1432* (2013.01); *H01L 2924/1436* (2013.01); *H01L 2924/1437* (2013.01); *H01L 2924/15311* (2013.01); *H01L 2924/19041* (2013.01); *H01L 2924/19042* (2013.01); *H01L 2924/19043* (2013.01); *H01L 2924/19102* (2013.01)

(58) Field of Classification Search
CPC . H01L 21/78; H01L 23/3107; H01L 23/3128; H01L 23/3135; H01L 23/481; H01L 24/05; H01L 24/19; H01L 24/97
USPC .......................................................... 438/458
See application file for complete search history.

(56) References Cited

U.S. PATENT DOCUMENTS

| | | |
|---|---|---|
| 8,048,778 B1 * | 11/2011 | Ku .......................... H01L 21/78 438/462 |
| 8,076,756 B2 | 12/2011 | Lane et al. |
| 8,298,963 B2 | 10/2012 | Akiba et al. |
| 8,361,842 B2 | 1/2013 | Yu et al. |
| 8,536,694 B2 | 9/2013 | Inomata |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,791,574 B2 | 7/2014 | Akiba et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,337,154 B2 | 5/2016 | Miao et al. |
| 9,391,046 B2 | 7/2016 | Park et al. |
| 9,553,000 B2 | 1/2017 | Yu et al. |
| 9,947,630 B2 | 4/2018 | Yang et al. |
| 2005/0140006 A1 | 6/2005 | Taskahashi |
| 2008/0006942 A1 | 1/2008 | Park et al. |
| 2010/0181681 A1 | 7/2010 | Akiba et al. |
| 2011/0031615 A1 | 2/2011 | Inomata |
| 2011/0291288 A1 | 12/2011 | Wu et al. |
| 2012/0292745 A1 | 11/2012 | Park et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0064338 A1 | 3/2016 | Miao et al. |

FOREIGN PATENT DOCUMENTS

| | | |
|---|---|---|
| CN | 104253053 A | 12/2014 |
| TW | 200910524 A | 3/2009 |

\* cited by examiner

PACKAGE WITH TILTED INTERFACE BETWEEN DEVICE DIE AND ENCAPSULATING MATERIAL

PRIORITY CLAIM AND CROSS-REFERENCE

This application is a continuation of U.S. patent application Ser. No. 15/924,916, entitled "Package with Tilted Interface between Device Die and Encapsulating Material," filed Mar. 19, 2018, which is a divisional of U.S. patent application Ser. No. 15/254,472, entitled "Package with Tilted Interface between Device Die and Encapsulating Material," filed Sep. 1, 2016, now U.S. Pat. No. 9,922,895, issued Mar. 20, 2018, which claims the benefit of the following provisionally filed U.S. Patent application: application Ser. No. 62/332,252, filed May 5, 2016, and entitled "Package with Tilted Interface between Device Die and Encapsulating Material," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
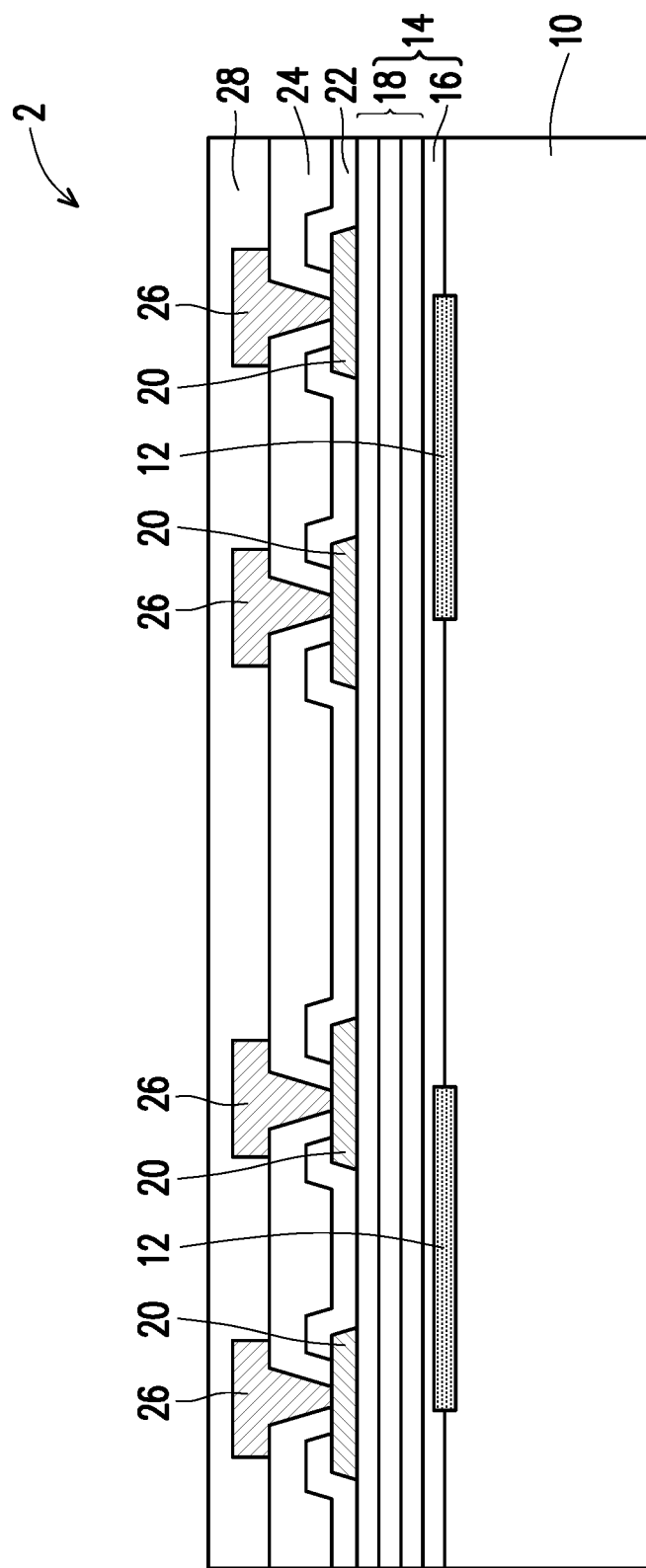
FIGS. 1 through 17B illustrate the cross-sectional views of intermediate stages in the formation of fan-out packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out package and the method of forming the package are provided in accordance with various exemplary embodiments. Some variations of the embodiments are discussed. Throughout the various views and illustrative embodiments, like reference numbers are used to designate like elements.

FIGS. 1 through 17B illustrate the cross-sectional views of intermediate stages in the formation of packages in accordance with some embodiments. The steps shown in FIG. 1 through 17B are also illustrated schematically in the process flow 200 as shown in FIG. 18.

Referring to FIG. 1, wafer 2 is provided. Wafer 2 includes substrate 10, which may be a semiconductor substrate such as a silicon substrate, while it may be formed of other semiconductor materials such as silicon germanium, silicon carbon, III-V compound semiconductor materials, or the like. Semiconductor devices 12, which may be transistors, capacitors, resistors, diodes, or the like, may be formed at a surface of substrate 10. Interconnect structure 14, which includes metal lines and vias (not shown) formed therein, is formed over substrate 10. The metal lines and vias may be formed of copper or copper alloys, and may be formed using damascene processes. The metal lines and vias are electrically coupled to semiconductor devices 12. Interconnect structure 14 may include Inter-Layer Dielectric (ILD) 16 and Inter-Metal Dielectrics (IMDs) 18, wherein contact plugs (such as source/drain plugs and gate contact plugs) are formed in ILD 16, and the metal lines and vias are formed in IMDs 18. In accordance with alternative embodiments, wafer 2 is an interposer wafer, and is substantially free from integrated circuit devices including transistors, resistors, capacitors, inductors, and/or the like, formed therein.

Metal pads 20 are formed over interconnect structure 14. Metal pads 20 may include aluminum (Al), copper (Cu), silver (Ag), gold (Au), nickel (Ni), tungsten (W), alloys thereof, and/or multi-layers thereof. Metal pads 20 may be electrically coupled to semiconductor devices 12, for example, through the metal lines, vias, and contact plugs in the underlying interconnect structure 14. Passivation layer 22 is formed to cover edge portions of metal pads 20. In accordance with some exemplary embodiments, passivation layer 22 includes a silicon oxide layer and a silicon nitride layer over the silicon oxide layer, although other dielectric materials may be used. An opening is formed in passivation layer 22 to expose the underlying metal pads 20.

Polymer layer 24 is formed over passivation layer 22, wherein polymer layer 24 extends into the openings in passivation layer 22. Polymer layer 24 may be formed of polybenzoxazole (PBO), benzocyclobutene (BCB), polyimide, or the like. Openings are formed in polymer layer 24 to expose metal pads 20.

Metal vias 26 are formed to extend into polymer layer 24, and are in contact with metal pads 20. The respective formation step is shown as step 202 in the process flow shown in FIG. 18. Metal vias 26 may be formed of copper, aluminum, nickel, alloys thereof, and/or multi-layers thereof. In accordance with some embodiments of the present disclosure, the formation of metal vias 26 includes patterning polymer layer 24 to form openings, through which metal pads 20 are exposed. A seed layer (not shown) is then formed over, and extending into the openings of, polymer layer 24. The seed layer may be formed of a barrier/adhesion layer comprising titanium, titanium nitride, tantalum, tantalum nitride, or the like, and a copper or copper alloy layer over the barrier/adhesion layer. A photo resist (not shown) is then formed over the seed layer and then patterned, followed by a plating process to form metal vias 26. The photo resist is then removed. The portions of the seed layer previously covered by the photo resist are then etched, leaving metal vias 26. Metal vias 26 are electrically coupled to integrated circuit devices 12 through metal pads 20 and the metal lines and vias in interconnect structure 14.

Polymer layer 28 is then formed to cover and protect metal vias 26. The respective step is shown as step 204 in the process flow shown in FIG. 18. In accordance with some embodiments of the present disclosure, polymer layer 28 is formed of PBO, polyimide, BCB, or the like. Polymer layer 28 may be formed of a material the same as, or different from, the material of polymer layer 24. In accordance with some embodiments, polymer layer 28 is formed of a material that is softer than the material of polymer layer 24.

Figure 2:
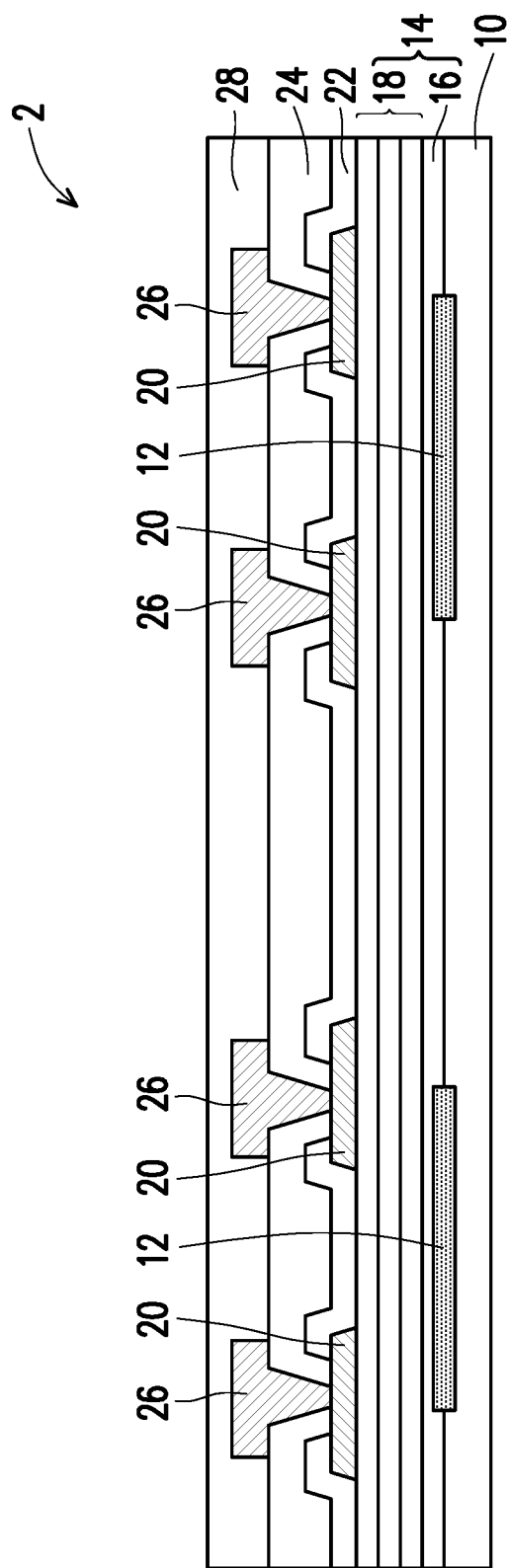

A backside grinding is then performed to reduce the thickness of wafer 2, and the resulting structure is shown in FIG. 2. The respective step is shown as step 206 in the process flow shown in FIG. 18. The backside grinding may be performed, for example, by attaching the top side of wafer 2 to a carrier (not shown), and performing a mechanical grinding or Chemical Mechanical Polish (CMP) on the backside of substrate 10. The thickness of substrate 10 may be reduced to about 20 microns to several hundred microns, for example.

Figure 3A:
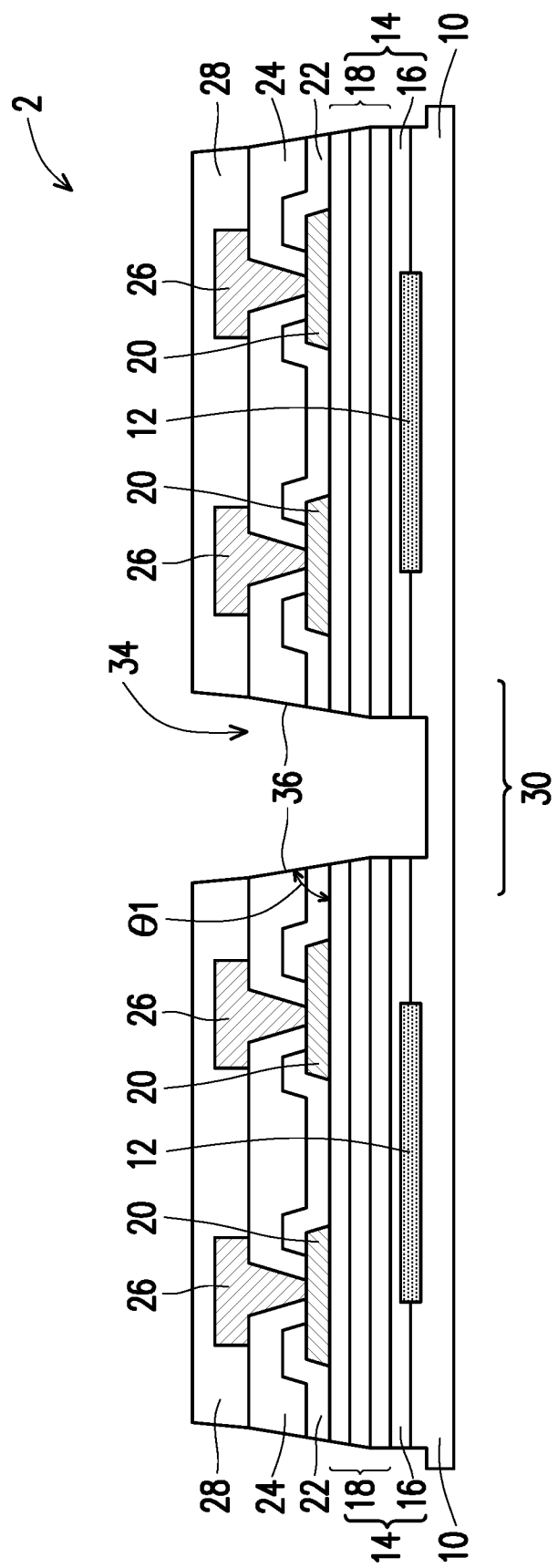

Referring to FIG. 3A, wafer 2 is grooved. The respective step is shown as step 208 in the process flow shown in FIG. 18. The grooving may be performed by projecting a laser beam on wafer 2 to burn-out some portions of wafer 2. The grooving results in trench 34 in scribe line 30, which separates two neighboring rows or columns of the chips in wafer 2. In the top view of wafer 2, there is a plurality of trenches 34 formed, wherein each of the scribe lines 34 of wafer 2 has a trench the same as trench 34 formed in. The trenches thus form a grid pattern in the top view. The plurality of trenches has cross-sectional views similar to the illustrated and discussed trench 34, and is not shown separately.

Trench 34 penetrates through polymer layers 24 and 28, and may further penetrate through interconnect structure 14 to reach substrate 10. Accordingly, a top surface of substrate 10, which is recessed by the laser beam, is exposed to trench 34. Trench 34 may further extend to an intermediate level between the top surface and the bottom surface of substrate 10.

In accordance with some embodiments, trench 34 has tilted sidewalls 36, which are formed by tilting the projecting directions of laser beam to form the desirable tilting angle. The tilting angle $\theta 1$ may be in the range between about 75 degrees and about 85 degrees, for example, although different angles may be adopted. Since the tilting angle $\theta 1$ is caused by the tilting of the laser beam, the tilting angle of the laser beam is the same as tilting angle $\theta 1$. In accordance with some embodiments, two laser beam scans tilting to opposite directions are performed to form two tilted sidewalls 36 tilting in the opposite directions.

Figure 3B:
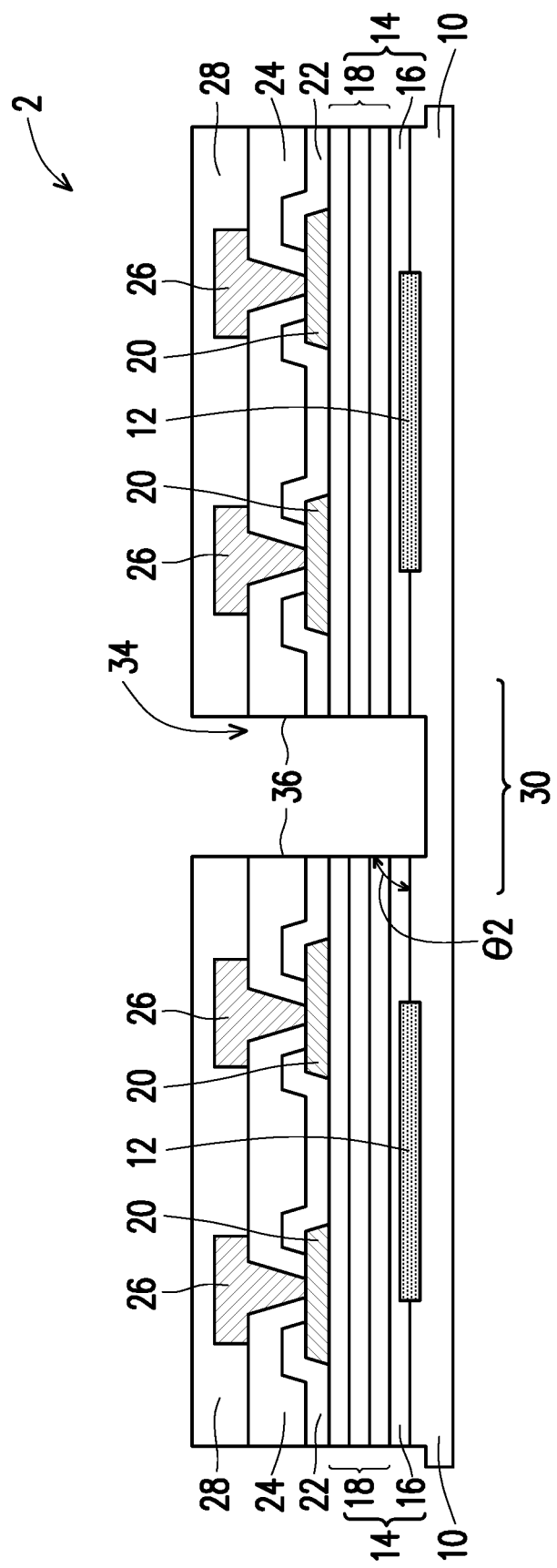

FIG. 3B illustrates the grooved wafer 2 in accordance with alternative embodiments, wherein edges 36 of trench 34 are vertical or substantially vertical (for example, with tilting angle $\theta 2$ being between about 88 degrees and 90 degrees. The trench 34 having the vertical sidewalls may be formed by projecting the laser beam in the vertical direction perpendicular to the top surface of substrate 10.

Figure 4:
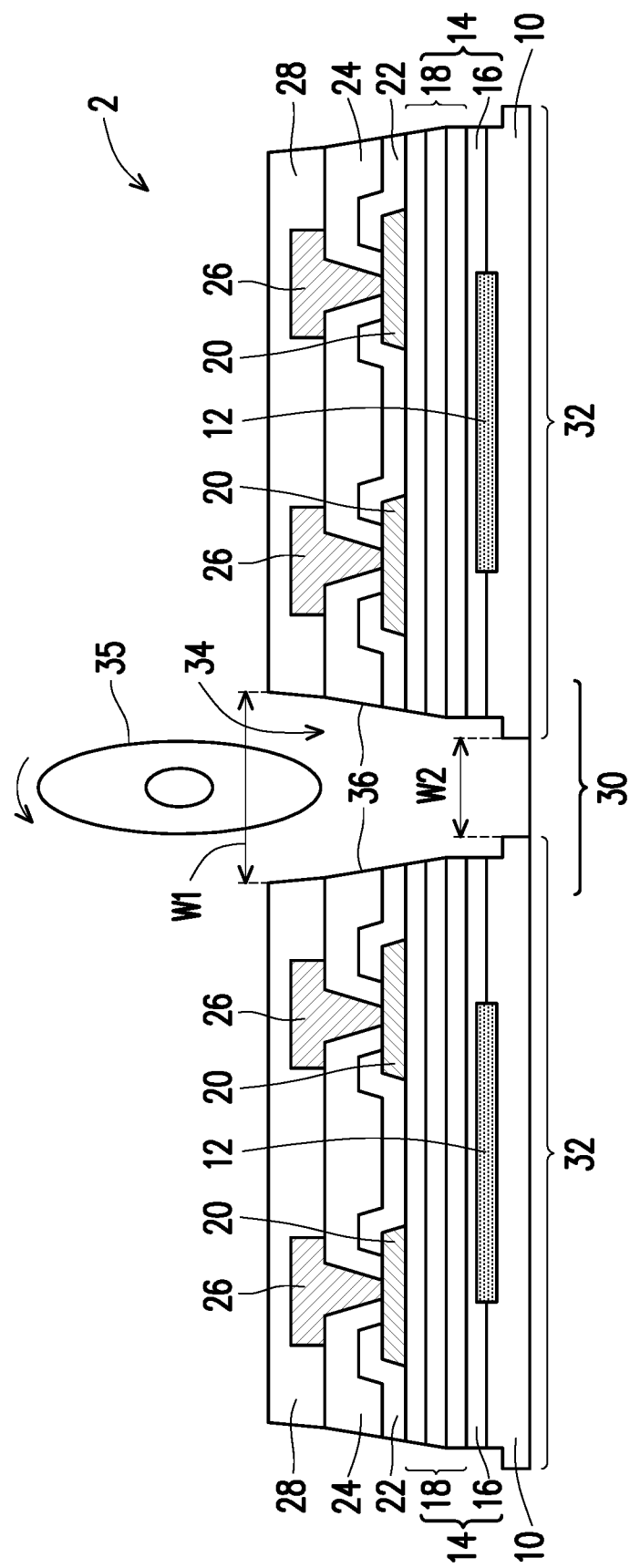

FIG. 4 illustrates the singulation (die-saw) of wafer 2 into a plurality of chips/device dies 32. The respective step is shown as step 210 in the process flow shown in FIG. 18. The singulation may be performed, for example, by using blade 35 to cut through scribe lines 30. In accordance with some embodiments, width W1 of trench 34 is in the range between about 40 μm and about 50 μm. Width W2 of the kerves caused by the singulation may be in the range between about 30 μm and about 35 μm. Advantageously, in the grooving, a plurality of layers such as layers 28, 24, 22, 18, and 16 is pre-grooved. Furthermore, since width W2 of the kerves is smaller than width W1 of trench 34, in the singulation, the blade does not cut through the already grooved layers, and hence layers 28, 24, 22, 18, and 16 will not be peeled/delaminated by the blade. The resulting device dies 32 may include logic dies such as Central Processing Unit (CPU) dies, Graphic Processing Unit (GPU) dies, mobile application dies, or the like.

Figure 5:
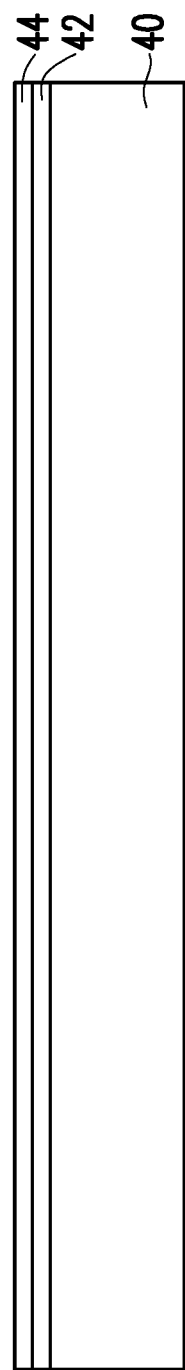

FIGS. 5 through 17A illustrate the intermediate stages in the packaging of device die 32 in accordance with some embodiments of the present disclosure. Referring to FIG. 5, carrier 40 is provided, and adhesive layer 42 is disposed over carrier 40. Carrier 40 may be a blank glass carrier, a blank ceramic carrier, or the like, and may have a shape of a semiconductor wafer with a round top-view shape. Carrier 40 is sometimes referred to as a carrier wafer. Adhesive layer 42 may be formed of a Light-to-Heat Conversion (LTHC) material, for example, although other types of adhesives may be used. In accordance with some embodiments of the present disclosure, adhesive layer 42 is capable of decomposing under the heat of light, and hence can release carrier 40 from the structure formed thereon.

Dielectric layer 44 is formed over adhesive layer 42. In accordance with some embodiments of the present disclosure, dielectric layer 44 is a polymer layer, which may be formed of a photo-sensitive polymer such as polybenzoxazole (PBO), polyimide, or the like. In accordance with some embodiments, dielectric layer 44 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 6:
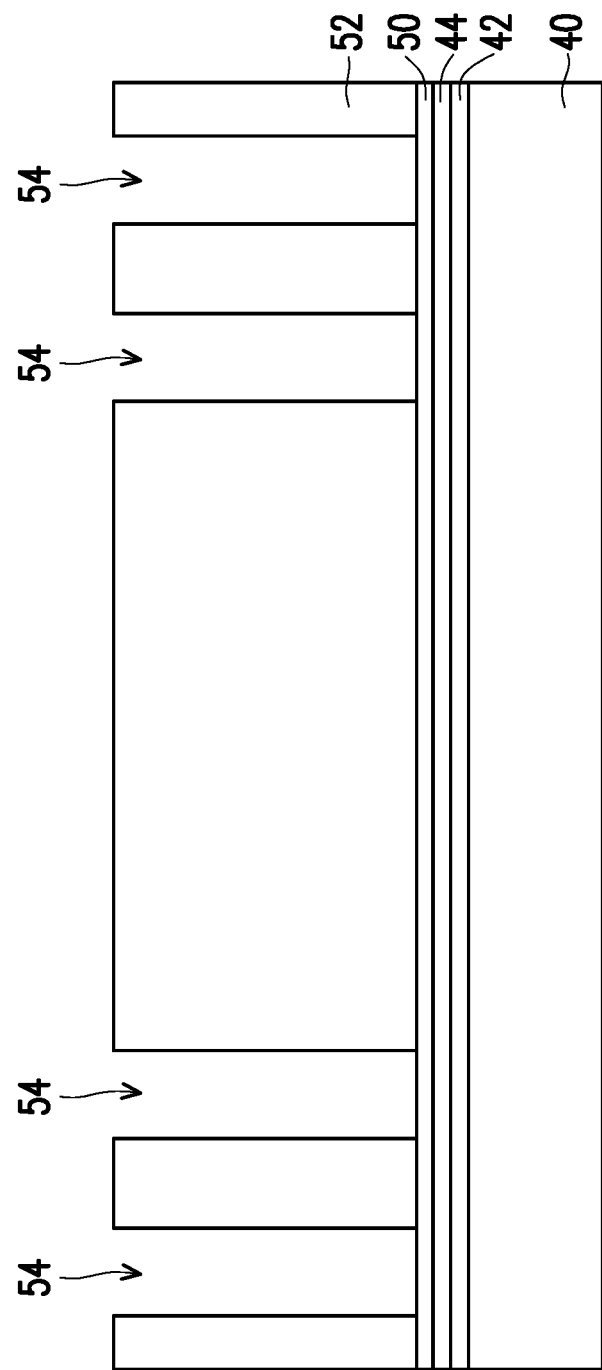
Figure 7:
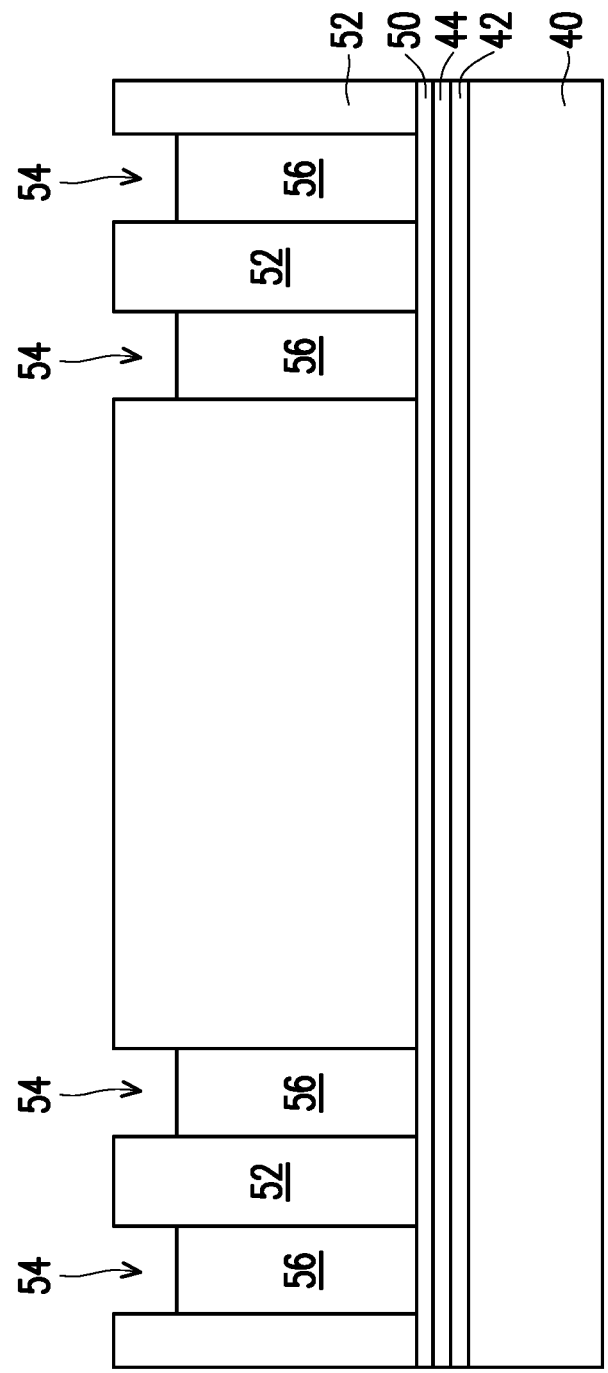
Figure 8:
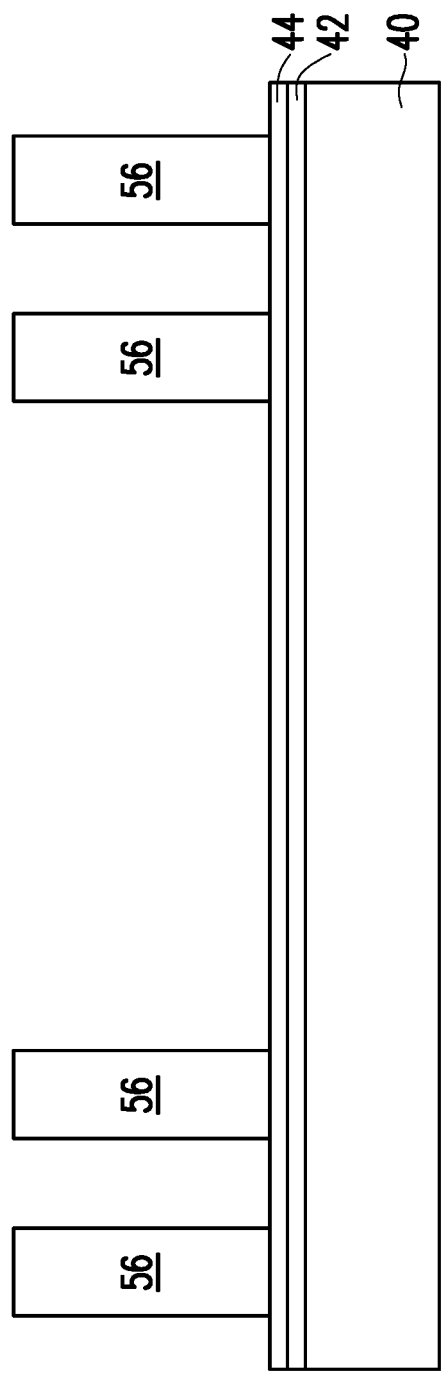

FIGS. 6 through 8 illustrate the formation of conductive/metal posts. The respective step is shown as step 212 in the process flow shown in FIG. 18. Referring to FIG. 6, conductive seed layer 50 is formed over dielectric layer 44, for example, through Physical Vapor Deposition (PVD). Conductive seed layer 50 may be a metal seed layer including copper, aluminum, titanium, alloys thereof, or multi-layers thereof. In accordance with some embodiments of the present disclosure, conductive seed layer 50 includes a first metal layer such as a titanium layer (not shown) and a second metal layer such as a copper layer (not shown) over the first metal layer. In accordance with alternative embodiments of the present disclosure, conductive seed layer 50 includes a single metal layer such as a copper layer, which may be formed of substantially pure copper or a copper alloy.

Mask layer 52 (such as a photo resist) is applied over conductive seed layer 50, and is then patterned using a photo lithography mask. In accordance with some embodiments of the present disclosure, photo resist 52 is a dry film, which is laminated onto conductive seed layer 50. In accordance with alternative embodiments, photo resist 52 is formed by spin coating. As a result of the patterning (exposure and development), openings 54 are formed in photo resist 52, through which some portions of conductive seed layer 50 are exposed.

As shown in FIG. 7, conductive posts 56 are formed in openings 54 through plating, which may be electro plating or electro-less plating. Conductive posts 56 are plated on the exposed portions of conductive seed layer 50. Conductive posts 56 may be metal posts formed of copper, aluminum, tungsten, nickel, or alloys thereof.

After the plating of conductive posts 56, photo resist 52 is removed. As a result, the portions of conductive seed layer 50 that are previously covered by photo resist 52 are exposed. Next, an etching step is performed to remove the exposed portions of conductive seed layer 50, wherein the etching may be an anisotropic or isotropic etching. The portions of conductive seed layer 50 that are overlapped by conductive posts 56, on the other hand, remain not etched. Throughout the description, the remaining underlying portions of conductive seed layer 50 are referred to as the bottom portions of conductive posts 56. The resulting structure is shown in FIG. 8. In FIG. 8 and subsequent drawings, the remaining portions of conductive seed layer 50 are considered as parts of conductive posts 56, and are not shown separately.

Figure 9:
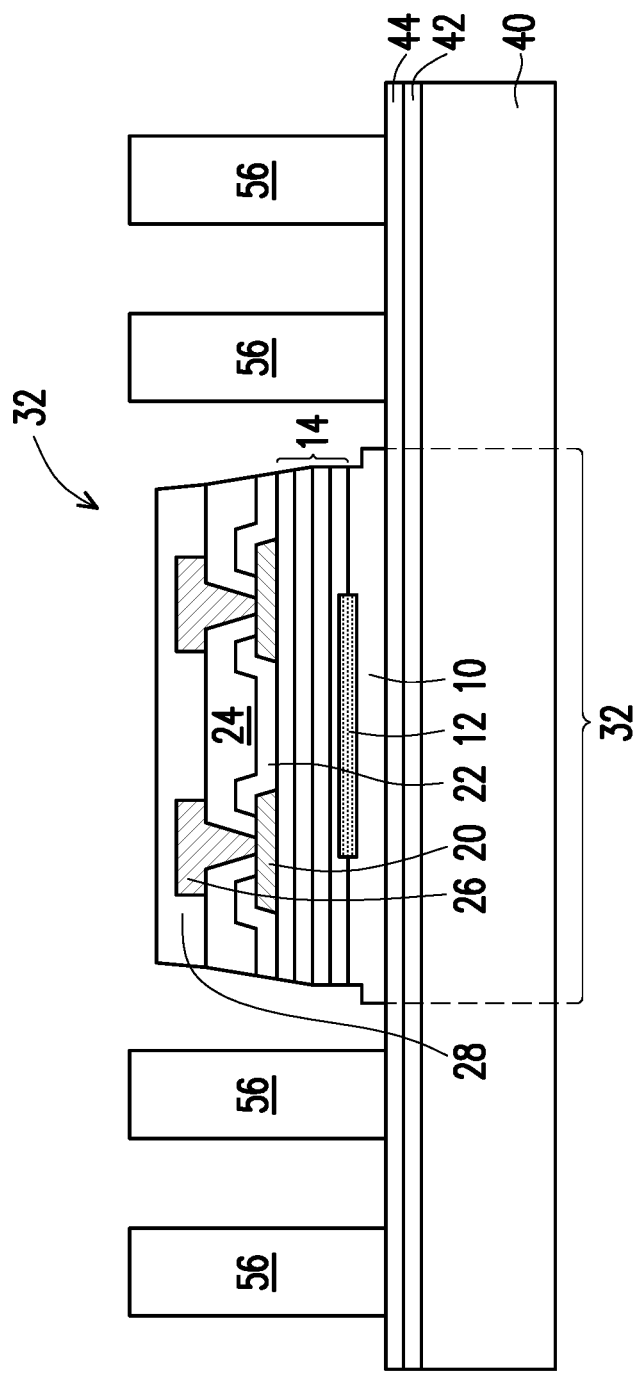

FIG. 9 illustrates the placement of device die 32 over dielectric layer 44 and carrier 40. The respective step is shown as step 214 in the process flow shown in FIG. 18. Device die 32 may be attached to dielectric layer 44 through a die attach film (not shown). The die attach film may be adhered to the bottom surface of wafer 2 (FIG. 4) before the singulation, and then sawed along with wafer 2 in the singulation step. As a result, the edges of the die attach film are co-terminus as device die 32. It is appreciated that the packaging is performed at the wafer level, and although there is one device die 32 illustrated, a plurality of placed device dies identical to device die 32 is actually placed over dielectric layer 44, wherein the plurality of placed device dies is arranged as an array including a plurality of rows and a plurality of columns.

Figure 10:
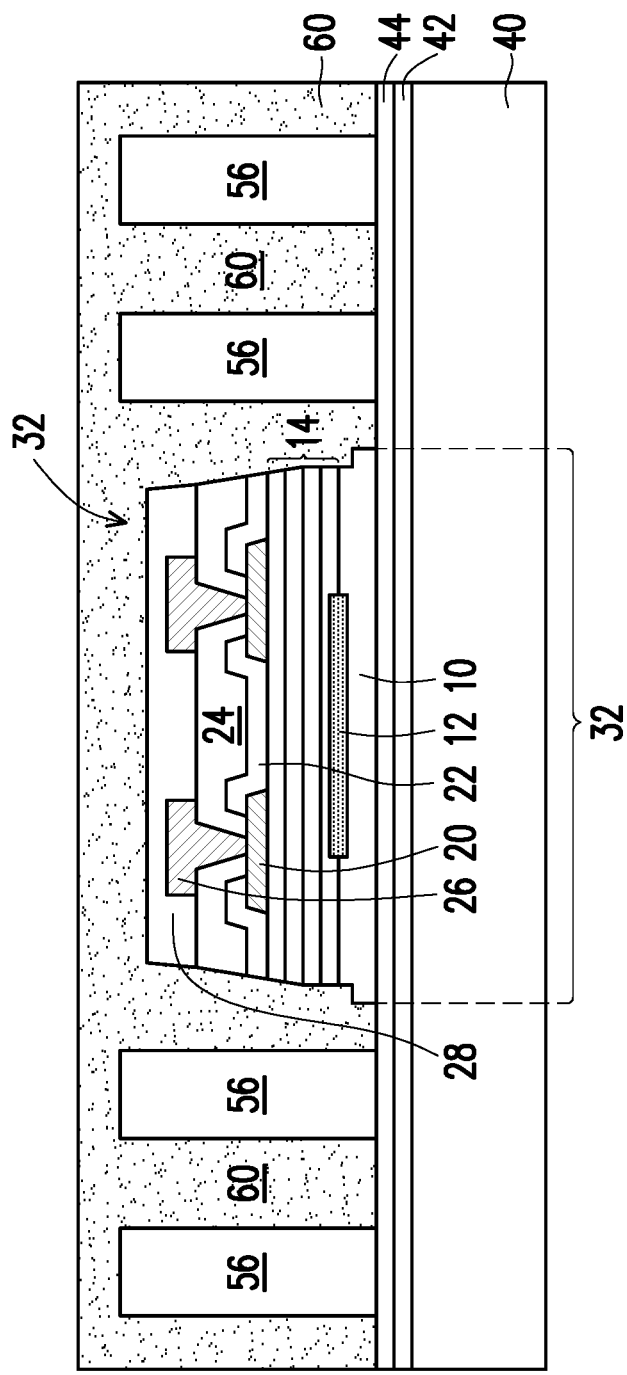

Referring to FIG. 10, encapsulating material 60 is dispensed on device die 32 and conductive posts 56. The respective step is shown as step 216 in the process flow shown in FIG. 18. Encapsulating material 60 fills the gaps between device die 32 and conductive posts 56, and may be in contact with dielectric layer 44. Encapsulating material 60 may include a molding compound, a molding underfill, an epoxy, or a resin. Encapsulating material 60 may include a polymer-based material and filler particles, which may be formed of silicon oxide, aluminum oxide, or the like. The top surface of encapsulating material 60 is higher than the top ends of metal vias 26 and conductive posts 56.

Figure 11:
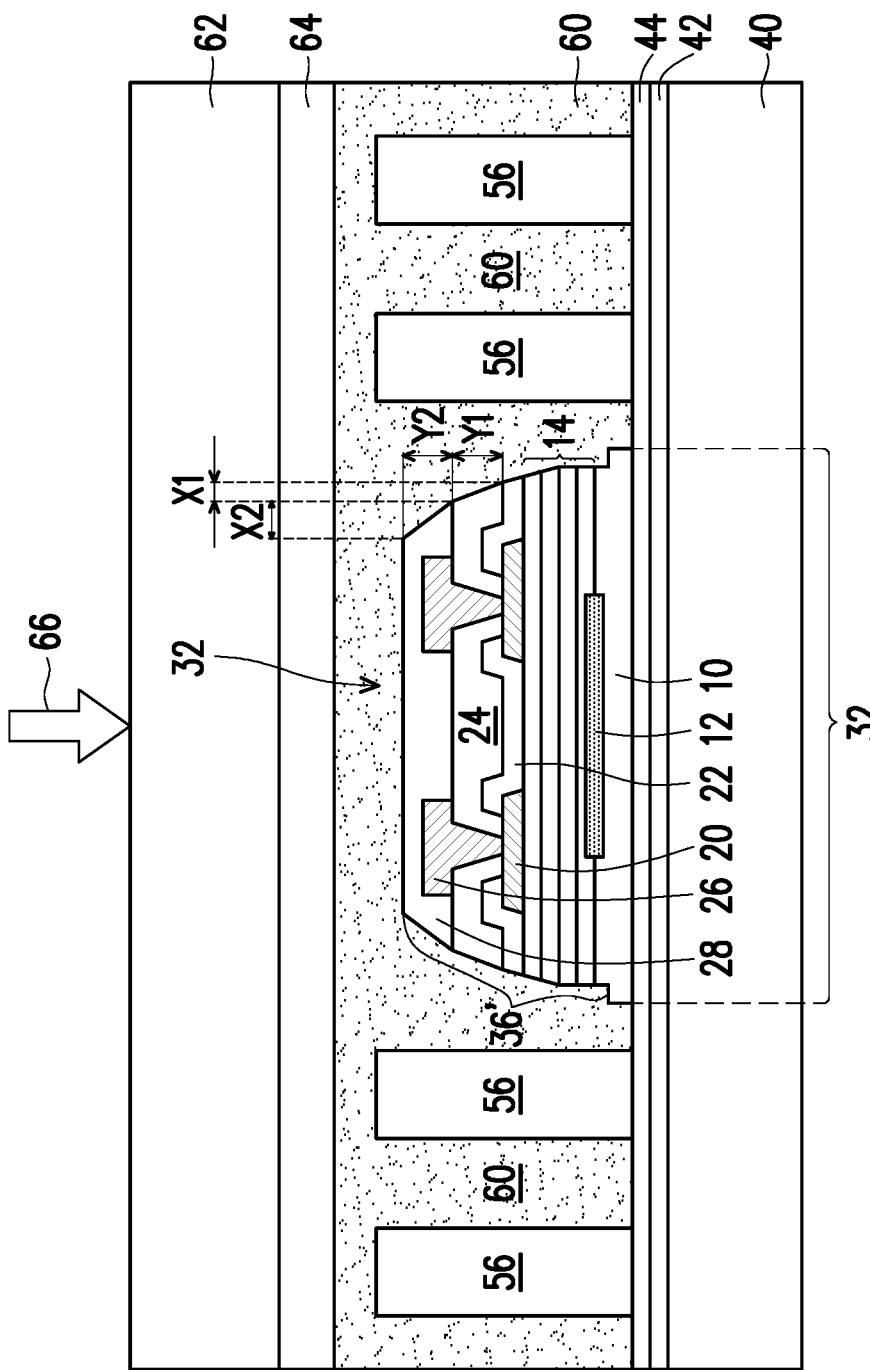

Referring to FIG. 11, encapsulating material 60 is compressed and cured. The respective step is shown as step 218 in the process flow shown in FIG. 18. The compression may be performed by using top mold 62 and release film 64 to push encapsulating material 60. The pushing force is represented by arrow 66. Through the compression, encapsulating material 60 is spread more uniformly, so that no void is formed in encapsulating material 60. During the compression, a mold (not shown) surrounds, and may be underlying, carrier 40 to hold encapsulating material 60. During the compression, encapsulating material 60 is cured, for example, by a heating.

Figure 12:
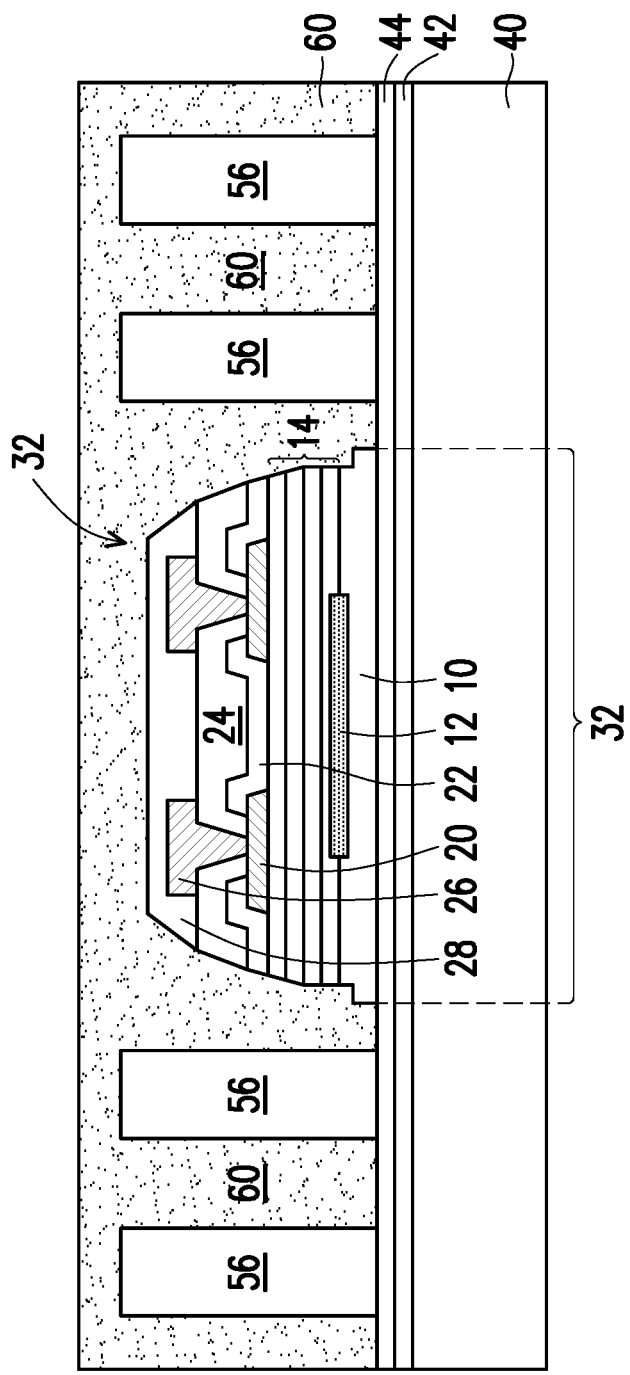

As shown in FIG. 11, slanted sidewalls 36' are generated. There are several reasons that may cause slanted sidewalls 36' to have the profile as shown in FIG. 11. For example, the tilted sidewalls 36' receive the downward pressing force, and hence the downward force is partially converted to lateral force due to the tilting of sidewalls 36 (FIG. 4). Also, the compression of encapsulating material 60 also contributes to the lateral force. The top layers 24 and 28 are polymer layers, which are soft, and hence yield to the lateral force pushing these layers toward the center line of device die 32. Furthermore, the sidewalls of layers 24 and 28, which are portions of sidewalls 36', are curved. In accordance with some embodiments, each of the sidewalls of layers 24 and 28 is continuously curved with no abrupt changes in the slope therein. There may be, or may not be, an abrupt change in slopes at the interfaces between layers 24 and 28. When being compressed, encapsulating material 60 is cured, and the profile as shown in FIG. 11 is fixed. Mold 62 and release film 64 are then removed, as shown in FIG. 12.

Figure 13:
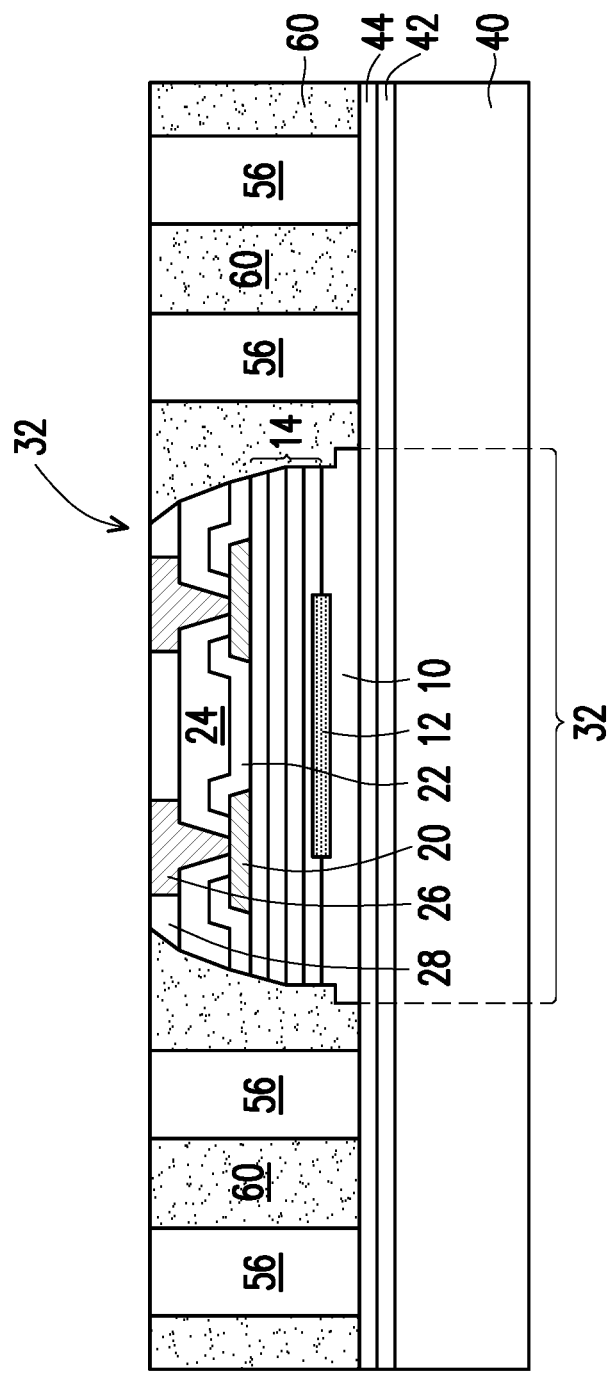

Next, a planarization step such as a CMP step or a grinding step is performed to planarize encapsulating material 60, until conductive posts 56 and metal vias 26 are exposed. The respective step is shown as step 220 in the process flow shown in FIG. 18. The resulting structure is shown in FIG. 13. Metal vias 26 of device die 32 are also exposed as a result of the planarization. Due to the planarization, the top surfaces of conductive posts 56 are substantially level (coplanar) with the top surfaces of metal vias 26, and are substantially level (coplanar) with the top surface of encapsulating material 60. Due to the planarization, some spherical filler particles (not shown) in encapsulating material 60 have their top portions removed, and hence leaving the filler particles with planar top surfaces and rounded sidewalls and bottom surfaces.

Figure 14:
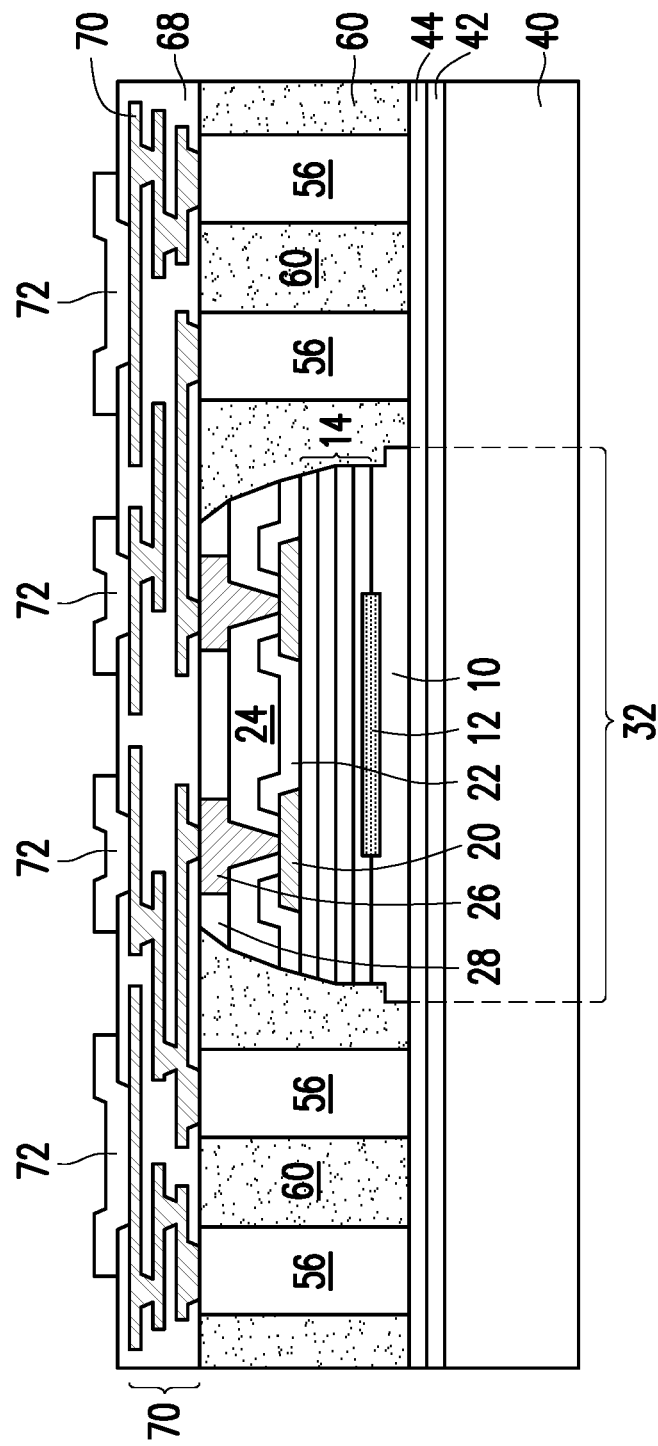

Referring to FIG. 14, one or more layers of dielectric layers 68 and the respective Redistribution Lines (RDLs) 70 are formed over encapsulating material 60, conductive posts 56, and metal vias 26. The respective step is shown as step 222 in the process flow shown in FIG. 18. RDLs 70 are referred to as front side RDLs since they are on the front side of device die 32. In accordance with some embodiments of the present disclosure, dielectric layers 68 are formed of a polymer(s) such as PBO, polyimide, or the like. In accordance with alternative embodiments of the present disclosure, dielectric layers 68 are formed of an inorganic dielectric material(s) such as silicon nitride, silicon oxide, silicon oxynitride, or the like.

RDLs 70 are formed to electrically couple to metal vias 26 and conductive posts 56. RDLs 70 may also interconnect metal vias 26 and conductive posts 56 with each other. RDLs 70 may include metal traces (metal lines) and vias underlying and connected to the metal traces. In accordance with some embodiments of the present disclosure, RDLs 70 are formed through plating processes, wherein each layer of RDLs 70 includes a seed layer (not shown) and a plated metallic material over the seed layer. The seed layer and the plated metallic material may be formed of the same material or different materials. Under-Bump Metallurgies (UBMs) 72 are then formed to extend into the top dielectric layer 68 and in contact with the metal pads in the top RDLs 70.

Figure 15:
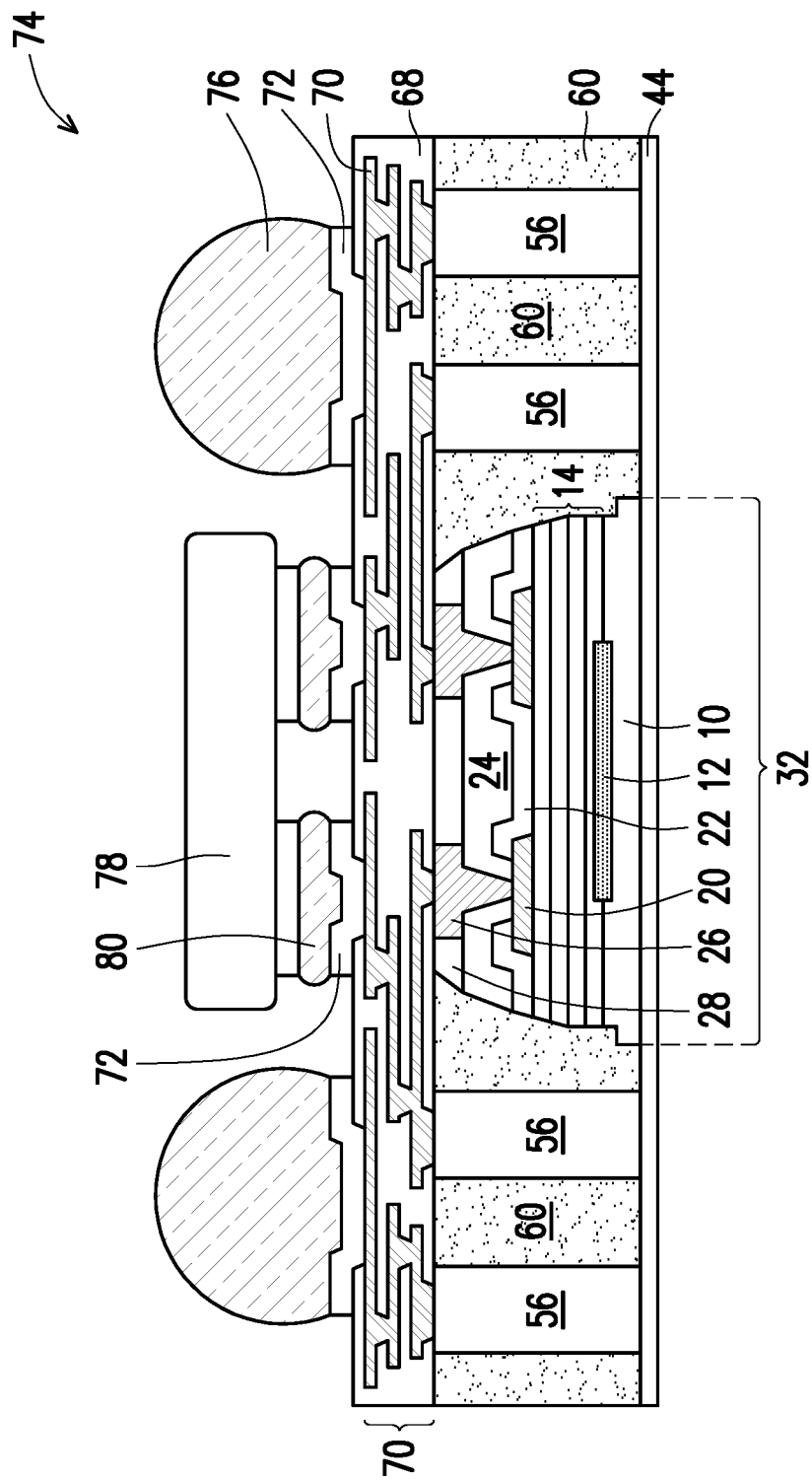

As shown in FIG. 15, electrical connectors 76 are formed on UBMs 72. The formation of electrical connectors 76 may include placing solder balls over RDLs 70 and then reflowing the solder balls. In accordance with alternative embodiments of the present disclosure, the formation of electrical connectors 76 includes performing a plating step to form solder regions over RDLs 70 and then reflowing the solder regions. Electrical connectors 76 may also include metal pillars, or metal pillars and solder caps, which may also be formed through plating. Throughout the description, the combined structure including device die 32, conductive posts 56, encapsulating material 60, RDLs 70, and dielectric layers 68 will be referred to as composite wafer 74, which is a composite wafer including a plurality of device dies 32. Carrier 40 (FIG. 14) may then be de-bonded from composite wafer 74. As also shown in FIG. 15, surface-mount device 78, which may be a discrete passive device such as a capacitor, a coil, a transformer, or the like, is bonded to composite wafer 74 through solder regions 80.

Figure 16:
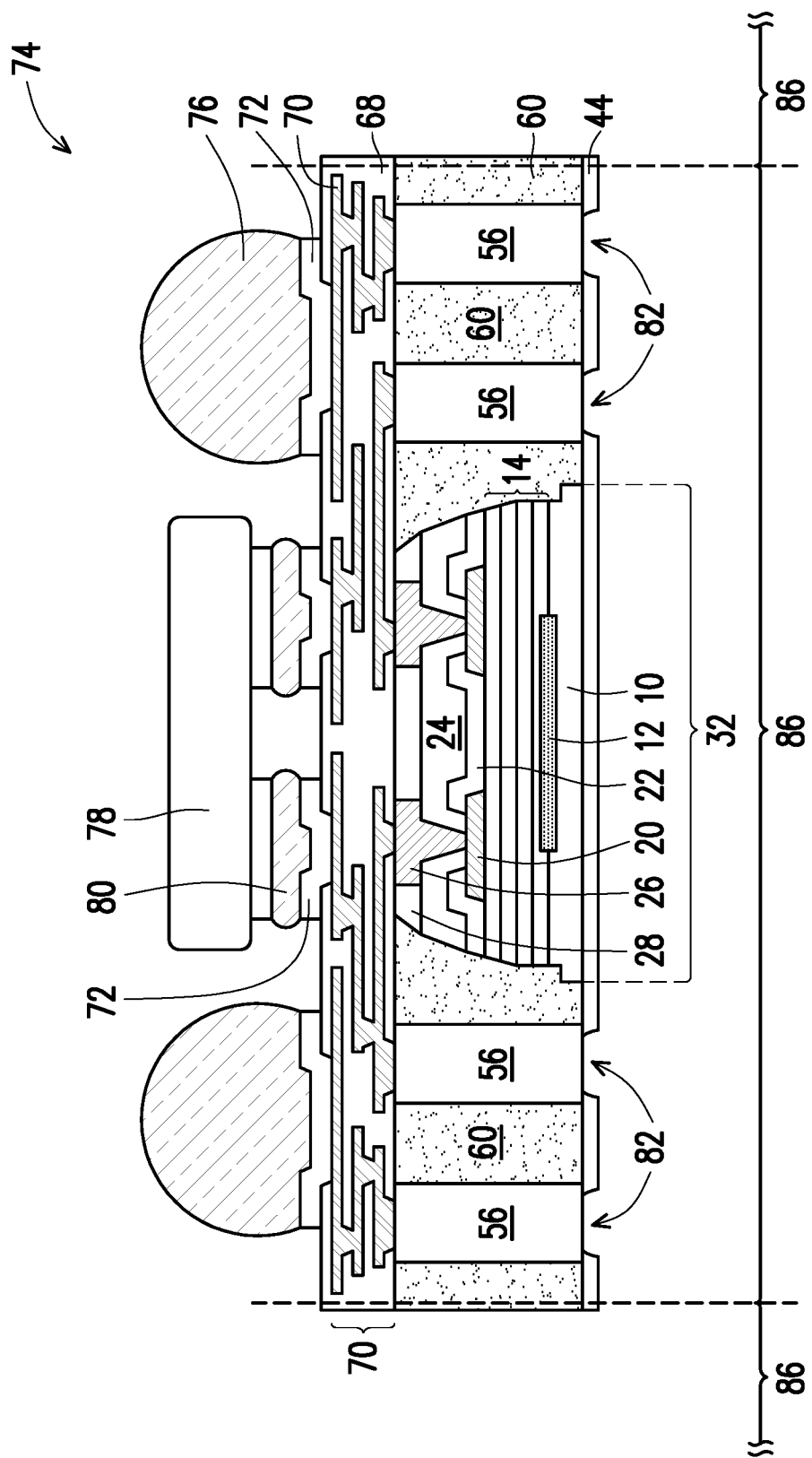

Referring to FIG. 16, openings 82 are formed in dielectric layer 44 to expose metal posts 56. Openings 82 may be formed through laser drill, for example. A die-saw is then performed to singulate composite wafer 74 into a plurality of packages 86, each including (at least) one of device dies 32 and the corresponding conductive posts 56. The respective step is also shown as step 224 in the process flow shown in FIG. 18. In accordance with some embodiments of the present disclosure, the die-saw is performed using a blade, which is rotated to cut composite wafer 74 during the die-saw. The respective step is shown as step 224 in the process flow shown in FIG. 18.

Figure 17A:
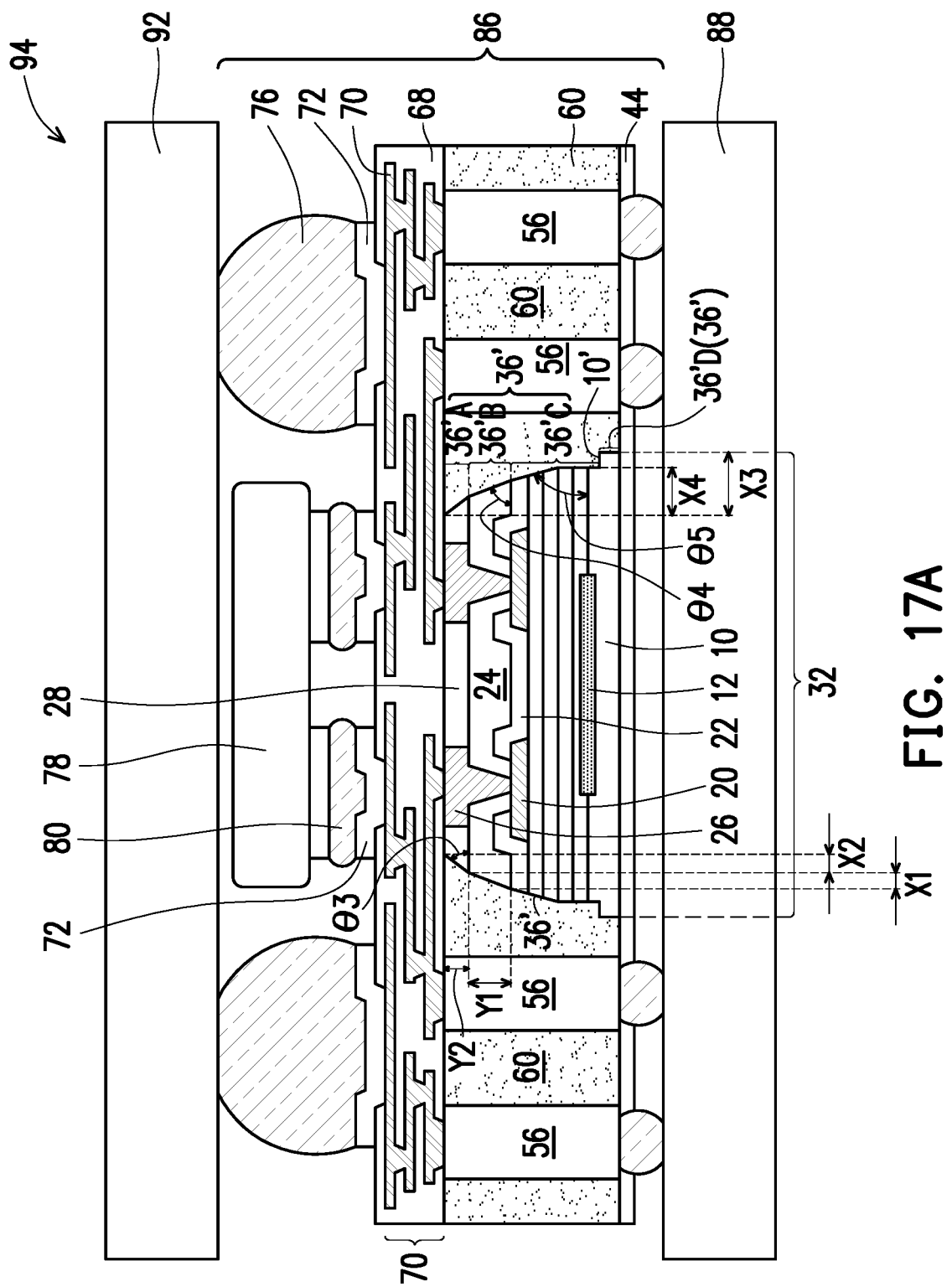
Figure 18:
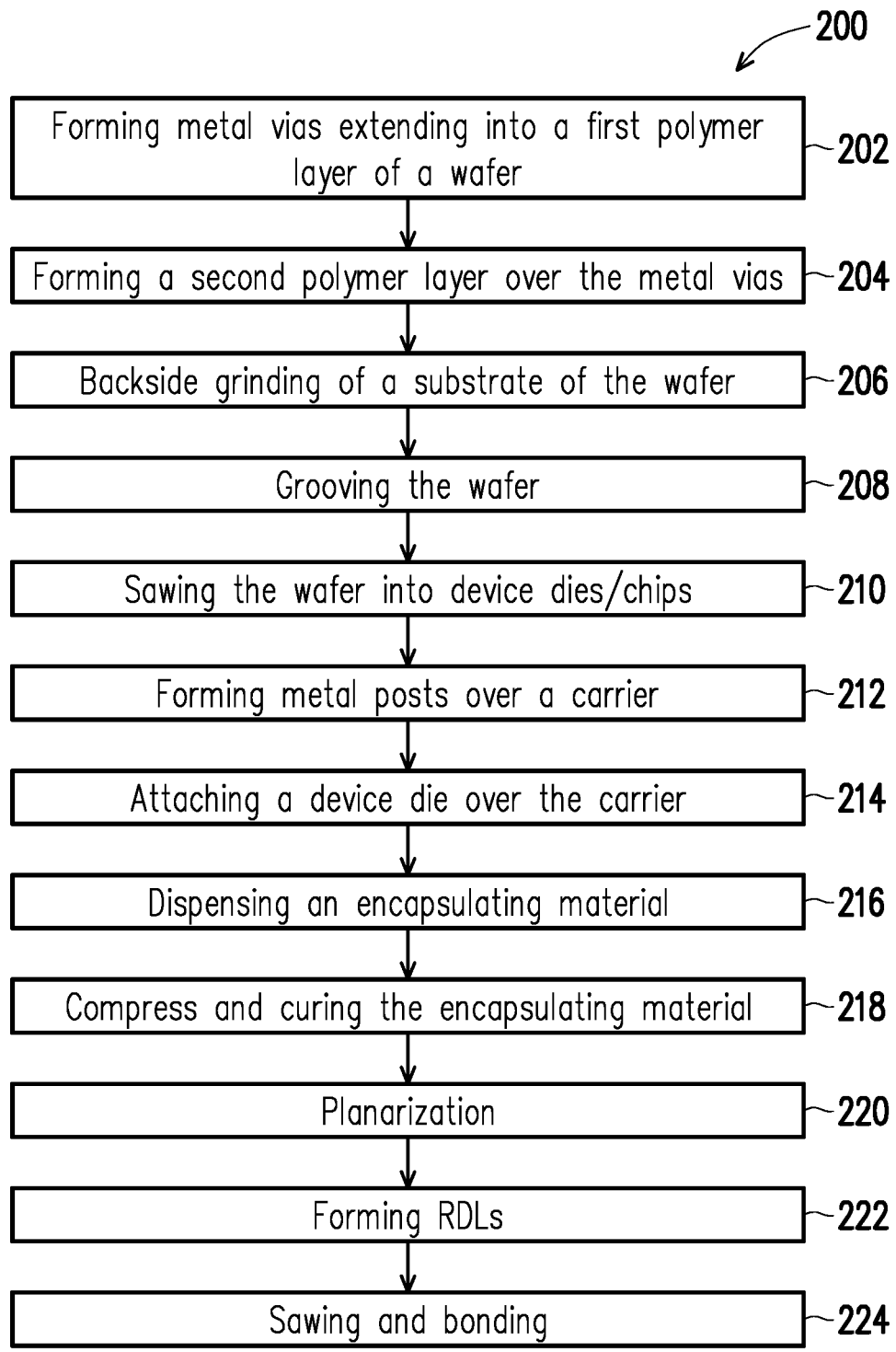
FIG. 18 illustrates a process flow for forming a package in accordance with some embodiments.

FIG. 17A illustrates the bonding of package components 88 and 92 to package 86, thus forming package 94. In accordance with some embodiments of the present disclosure, package component 88 may include device die(s), which may be memory dies such as Static Random Access Memory (SRAM) dies, Dynamic Random Access Memory (DRAM) dies, or the like. Package component 92 may be a package, a package substrate, a Printed Circuit Board (PCB), an interposer, or the like. After the bonding, underfills (not shown) may be disposed into the gaps between package 88 and package components 88 and 92, and is then cured.

In the package 94 as shown in FIG. 17A, the sidewalls 36' of device die 32 includes tilted portions. For example, tilted portions 36'A are the sidewalls of polymer layer 28, tilted portions 36'B are the sidewalls of polymer layer 24, and portions 36C' (which may be tilted, not tilted, or partially tilted) are the sidewalls of passivation layer 22, dielectric layers 16 and 18, and substrate 10. Accordingly, the interface between encapsulating material 60 and device die 32 also include tilted portions.

In accordance with some embodiments, sidewall portion 36'A of polymer layer 28 has tilt angle θ3, which may be in the range between about 50 degrees and about 70 degrees. The top surface of polymer layer 28 is recessed laterally (toward the vertical center line of device die 32) the respective bottom surface by distance X2 (also refer to FIG. 11) in the range between about 2 μm and about 5 μm. Thickness Y2 of polymer layer 28 may be in the range between about 5 μm and about 15 μm. Sidewall portions 36'B of polymer layer 24 has tilt angle θ4, which is greater than tile angle θ3. Tilt angle θ4 may be in the range between about 70 degrees and about 85 degrees. The top surface of polymer layer 24 is recessed laterally relative to the respective bottom surface by a distance X1 in the range between about 1 μm and about 2 μm. Thickness Y1 of polymer layer 24 may be in the range between about 4 μm and about 6 μm.

Sidewalls 36'A and 36'B may also be curved. Furthermore, although there may be (or may not be) a discontinuity in the slope ratio of sidewalls 36'A and 36'B, the slopes of each of 36'A and 36'B may be continuously changed, with the upper portions of each of sidewalls 36'A and 36'B being increasingly more tilted than the respective lower portions.

Furthermore, distance X1 may be greater than, smaller than, or equal to distance X2, depending on the thicknesses Y1 and Y2 of polymer layers 24 and 28, respectively. For example, ratio X2/X1 may be in the range between about 0.1 and about 0.5, in the range between about 0.6 and about 1, in the range between about 1 and about 2, or in the range between about 2 and about 8.

The top surface of polymer layer 28 is laterally recessed from the respective outmost edge of substrate 10 by distance X3, which may be in the range between about 1.0 μm and about 1 μm, in the range between about 1.1 μm and about 3 μm, in the range between about 3.1 μm and about 5 μm, in the range between about 5.1 μm and about 10 μm, or in the range between about 10.1 μm and about 20 μm. The top surface of polymer layer 28 is also laterally recessed from the respective edge of substrate 10 formed by grooving by distance X4, which may be in the range between about 1.0 μm and about 1 μm, in the range between about 1.1 μm and about 3 μm, in the range between about 3.1 μm and about 5 μm, in the range between about 5.1 μm and about 10 μm, or in the range between about 10.1 μm and about 20 μm. In accordance with some embodiments, value (X3−X4) is greater than about 0.1 μm, and may be in the range between about 0.1 μm and about 0.9 μm, in the range between about 1 μm and about 3 μm, or in the range between about 3.1 μm and about 20 μm.

The surfaces of substrate 10 may form a step, which step contacts encapsulating material 60. The step is formed of sidewall portion 36'C, sidewall portion 36'D, and horizontal surface 10' of substrate 10. The sidewall portion 36'D (the sidewalls of substrate 10) is vertical and perpendicular to the bottom surface of substrate 10. Sidewall portion 36'C may be vertical or tilted. If tilted, the tilt angle θ5 of sidewall portions 36'C is greater than both tilt angles θ3 and θ4.

Figure 17B:
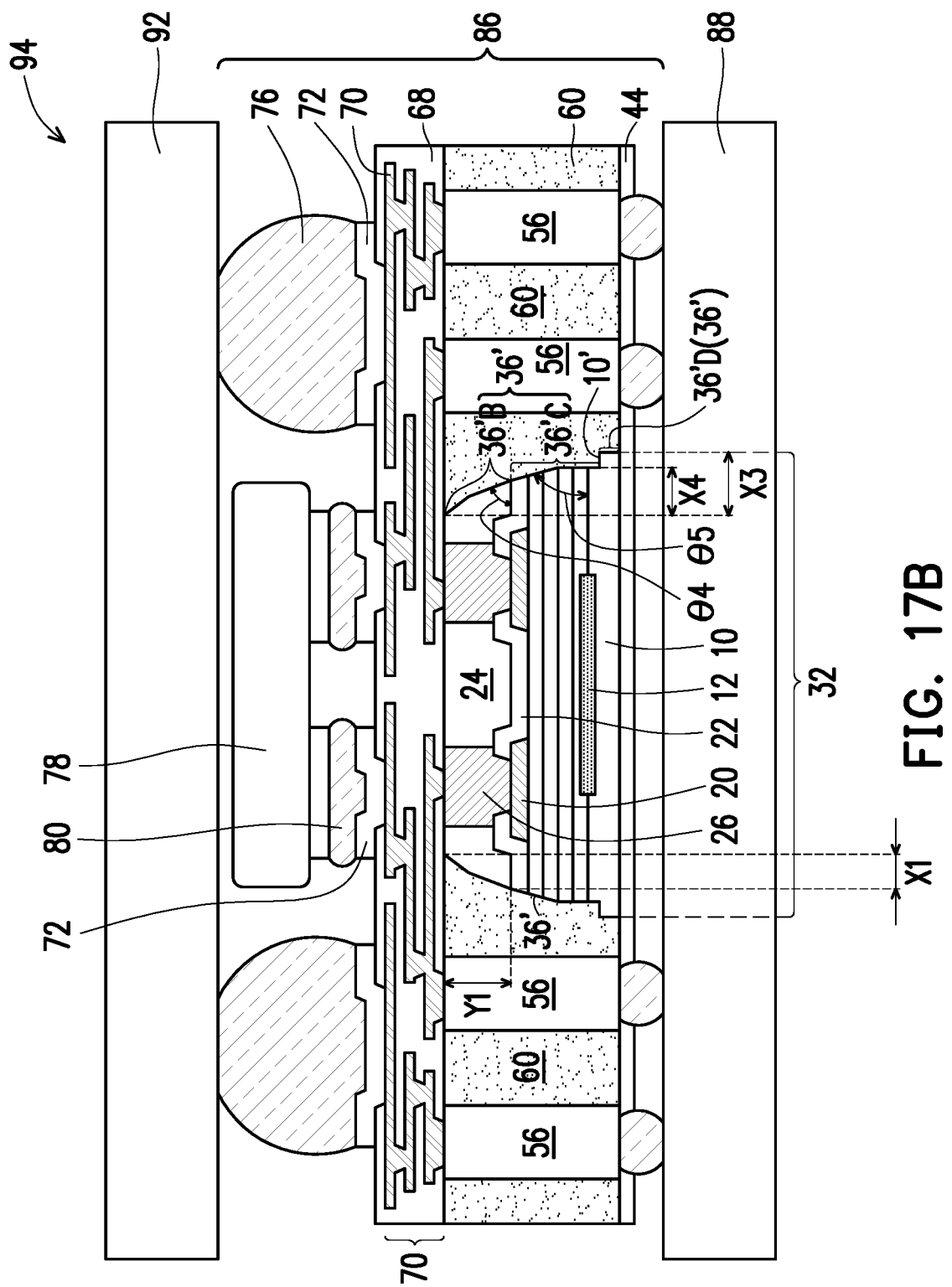

FIG. 17B illustrates package 94 formed in accordance with some embodiments of the present disclosure, the package is similar to the package 94 shown in FIG. 17A, except that instead of forming two polymer layers 24 and 28, a single polymer layer 24 is formed, which extends from passivation layer 22 to dielectric layers 68. Metal vias 26 are formed in polymer layer 24. In accordance with some embodiments, each of sidewall 36' includes tilted (which may be curved) portions. The details are similar to what are shown and discussed for FIG. 17A, and may be found referring to the discussion of the corresponding features with the corresponding references numerals.

The embodiments of the present disclosure have some advantageous features. The sidewalls of device die 32 are tilted. The tilt sidewalls advantageously smoothen the downward movement of encapsulating material 60 during the compress molding, and hence reduce the stress suffered by the molded device die. Furthermore, the tilted sidewalls make it easy for encapsulating material 60 to be compressed aside of device die 32 instead of being pressed directly onto device die 32, thus reduce the deformation of device die 32 in the compression of the encapsulating material.

In accordance with some embodiments of the present disclosure, a method includes forming a polymer layer covering a metal via in a wafer, grooving the wafer to form a trench, wherein the trench extends from a top surface of the polymer layer into the wafer, and performing a die-saw on the wafer to separate the wafer into a plurality of device dies. A kerf passes through the trench. One of the device dies is placed over a carrier. An encapsulating material is dispensed over and around the device die. The method further includes pressing and curing the encapsulating material. After the encapsulating material is cured, a sidewall of the polymer layer is tilted. A planarization is performed on the encapsulating material until the polymer layer and the metal via are exposed. A redistribution line is formed over and electrically coupled to the metal via.

In accordance with some embodiments of the present disclosure, a method includes performing a grooving on a wafer to form a plurality of trenches extending from a top surface of the wafer to an intermediate level of the wafer, and performing a die-saw on the wafer to separate the wafer into a plurality of device dies. Kerves of the die-saw pass through respective ones of the plurality of trenches, and the kerves are narrower than respective ones of the plurality of trenches. A device die in the plurality of device dies is placed over a carrier. The device die is encapsulated in an encapsulating material. After the device die is encapsulated, a sidewall of the device die is tilted. The method further includes performing a planarization on the encapsulating material until a metal via in the device die is exposed, and forming a redistribution line over and electrically coupling to the metal via.

In accordance with some embodiments of the present disclosure, a package includes a device die, which includes a substrate, and a sidewall with a tilted portion neither parallel to nor perpendicular to a bottom surface of the substrate. The package further includes an encapsulating material encapsulating the device die therein, wherein the tilted portion of the sidewall is in contact with the encapsulating material, a metal post penetrating through the encapsulating material, and redistribution lines over and electrically coupling to the metal post and device die.

In accordance with some embodiments of the present disclosure, a package includes a device die, which includes a semiconductor substrate, an interconnect structure over the semiconductor substrate, a metal pillar over and electrically coupled to the interconnect structure, and a polymer layer encircling the metal pillar. The polymer layer has a tilted sidewall, which is neither parallel to nor perpendicular to a major bottom surface of the semiconductor substrate. An encapsulating material encapsulates the device die therein. Redistribution lines are formed over and electrically coupling to the metal pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   performing a grooving process on a wafer to form a trench extending from a top surface of the wafer to an intermediate level of the wafer, wherein the intermediate level is between the top surface and a bottom surface of the wafer, and the wafer has a first tilted sidewall exposed to the trench;
   performing a die-saw process on the wafer to separate the wafer into a plurality of device dies;
   encapsulating a device die among the plurality of device dies in an encapsulant, wherein a sidewall of the device die is a part of the first tilted sidewall, and wherein the encapsulating comprises:
      dispensing the encapsulant to embed the device die therein; and
      pressing and simultaneously curing the encapsulant until the encapsulant is solidified; and
   forming a redistribution line over and electrically coupling to the device die.

2. The method of claim 1, wherein the grooving process comprises a first grooving process using a first laser beam, with the first laser beam being tilted in the first grooving process to form the first tilted sidewall.

3. The method of claim 2, wherein the grooving process comprises a second grooving process using a second laser beam, with the second laser beam being tilted in the second grooving process in a direction opposite to the first laser beam.

4. The method of claim 1, wherein the grooving process is performed until a semiconductor substrate of the wafer is exposed to the trench.

5. The method of claim 1, wherein in the die-saw process, a kerf passes through a middle portion of the trench, and the trench further comprises portions on opposite sides of the kerf.

6. The method of claim 1, wherein when the die-saw process is performed, the first tilted sidewall has a first tilt angle, and wherein during the pressing, a force is applied on the encapsulant causing the sidewall to have a second tilt angle greater than the first tilt angle.

7. The method of claim 1, wherein the pressing is achieved by applying the force on a top mold, wherein the top mold is on a release film, and the release film is over and contacting the encapsulant.

8. The method of claim 1, wherein after the encapsulating, a first portion of the first tilted sidewall has a first tilt angle in a range between about 50 degrees and about 70 degrees.

9. The method of claim 8, wherein after the encapsulating, a second portion of the first tilted sidewall has a second tilt angle in a range between about 70 degrees and about 85 degrees.

10. The method of claim 1, wherein after the encapsulating the device die, upper portions of the sidewall of the device die are more tilted than respective lower portions of the sidewall of the device die.

11. A method comprising:
forming a device die;
placing the device die over a carrier;
dispensing an encapsulant over and around the device die;
pressing and curing the encapsulant to result in upper portions of a sidewall of the device die to be more tilted than respective lower portions of the sidewall of the device die;
performing a planarization process on the encapsulant and the device die; and
forming a redistribution line over and electrically coupling to the device die.

12. The method of claim 11, wherein the pressing is performed simultaneously as the curing.

13. The method of claim 11, wherein the sidewall of the device die is tilted before the device die is placed on the carrier.

14. The method of claim 11 further comprising:
performing a grooving process on a wafer to form a tilted sidewall; and
sawing the wafer into a plurality of device dies, with the device die being among the plurality of device dies, and wherein the sidewall of the device die is a part of the tilted sidewall.

15. The method of claim 11, wherein after the encapsulant is cured, the sidewall is curved when viewed in a cross-sectional view of the device die.

16. A method comprising:
performing a grooving process on a wafer to form a trench extending from a top surface of the wafer to an intermediate level of the wafer, wherein the grooving process is performed using laser beams tilting toward opposite directions;
performing a die-saw process on the wafer to separate the wafer as a plurality of device dies, wherein a kerf of the die-saw process pass through a middle portion of the trench, and the trench further comprises additional portions on opposite sides of the kerf;
encapsulating a device die among the plurality of device dies in an encapsulant, wherein during the encapsulating, a tilting angle of a sidewall of the device die is increased;
performing a planarization process on the encapsulant until a conductive feature in the device die is exposed; and
forming a redistribution line over and electrically coupling to the conductive feature.

17. The method of claim 16, wherein the sidewall of the device die comprises:
upper portions having first sidewalls, with the first sidewalls having a first tilt angle; and
lower portions lower than the upper portions, wherein the lower portions have second tilt angles greater than the first tilt angle.

18. The method of claim 16, wherein the sidewall of the device die comprises:
a first portion, with the first portion being a sidewall of a first polymer layer; and
a second portion, with the second portion being a sidewall of a second polymer layer over the first polymer layer, wherein the second portion is more tilted than the first portion.

19. The method of claim 16, wherein the encapsulating the device die comprises:
curing the encapsulant; and
when the encapsulant is cured, simultaneously pressing the encapsulant.

20. The method of claim 1, wherein at a time the redistribution line is formed, upper portions of the device die are increasingly narrower than respective lower portions of the device die.

* * * * *